(12) United States Patent
Downes, Jr. et al.

(10) Patent No.: US 6,399,896 B1
(45) Date of Patent: Jun. 4, 2002

(54) CIRCUIT PACKAGE HAVING LOW MODULUS, CONFORMAL MOUNTING PADS

(75) Inventors: Frank J. Downes, Jr., Vestal; Donald S. Farquhar, Endicott; Robert M. Japp; William J. Rudik, both of Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/525,379

(22) Filed: Mar. 15, 2000

(51) Int. Cl.$^7$ .............................. H05K 1/16; H05K 1/03
(52) U.S. Cl. ................. 174/260; 174/255; 174/256; 174/262; 361/760; 361/767; 361/776; 361/783; 361/792; 361/803; 257/692; 257/698; 257/738; 257/778; 257/779
(58) Field of Search ................................. 174/260, 255, 174/256, 262, 266, 52.1, 52.2, 52.4, 258, 259; 361/760, 792, 767, 776, 807, 808, 748, 783, 718, 719; 257/692, 698, 739, 778, 779, 737, 738

(56) References Cited

U.S. PATENT DOCUMENTS

| | | | |
|---|---|---|---|
| 4,064,623 A | 12/1977 | Moore | |
| 4,413,308 A | 11/1983 | Brown | |
| 4,811,165 A | 3/1989 | Currier et al. | |
| 5,059,129 A | 10/1991 | Brodsky et al. | |
| 5,060,844 A | 10/1991 | Behun et al. | |
| 5,187,020 A | * 2/1993 | Kwon et al. ................. | 428/601 |
| 5,244,142 A | 9/1993 | Nishiguchi et al. | |
| 5,248,853 A | * 9/1993 | Ishikawa et al. ............. | 174/256 |
| 5,329,423 A | 7/1994 | Scholz | |
| 5,431,328 A | 7/1995 | Chang et al. | |
| 5,473,119 A | * 12/1995 | Rosenmayer et al. ........ | 174/255 |
| 5,703,331 A | 12/1997 | Brodsky et al. | |
| 5,759,047 A | 6/1998 | Brodsky et al. | |
| 5,790,377 A | 8/1998 | Schreiber et al. | |
| 5,834,848 A | * 11/1998 | Iwasaki ........................ | 257/778 |
| 5,900,674 A | * 5/1999 | Wojnarowski et al. ...... | 257/774 |
| 5,938,454 A | 8/1999 | Brodsky et al. | |
| 5,945,203 A | 8/1999 | Soane | |
| 5,956,235 A | 9/1999 | Kresge et al. | |
| 6,050,832 A | * 4/2000 | Lee et al. ...................... | 439/91 |
| 6,108,210 A | * 8/2000 | Chung ......................... | 361/747 |
| 6,126,456 A | * 10/2000 | Campbell et al. ............. | 439/74 |
| 6,165,817 A | * 12/2000 | Akram et al. ................ | 438/118 |
| 6,177,728 B1 | * 1/2001 | Susko et al. ................. | 257/737 |
| 6,191,952 B1 | * 2/2001 | Jimarez et al. ............. | 361/771 |

* cited by examiner

Primary Examiner—Jeffrey Gaffin
Assistant Examiner—I B Patel
(74) Attorney, Agent, or Firm—Whitham, Curtis & Christofferson, P.C.; Arthur J. Samodovitz

(57) ABSTRACT

Reliability of circuit packaging while accommodating larger chips and increased temperature excursions is achieved by use of compliant pads only at the locations of connections between packaging levels, preferably between a laminated chip carrier and a printed circuit board. The invention allows the coefficient of thermal expansion of the chip carrier to be economically well-matched to the CTE of the chip and accommodation of significant differences in CTEs of package materials to be accommodated at a single packaging level. The compliant pads are preferably of low aspect ratio which are not significantly deflected by accelerations and can be formed on a surface or recessed into it. Connections can be made through surface connections and/or plated through holes. Connection enhancements such as solder wettable surfaces or dendritic textures are provided in a conductive metal or alloy layer over a compliant rubber or elastomer layer which may be conductive or non-conductive.

12 Claims, 4 Drawing Sheets

CIRCUIT PACKAGE HAVING LOW MODULUS, CONFORMAL MOUNTING PADS

BACKGROUND OF THE INVENTION

1. Field of the Invention

The present invention generally relates to the packaging of integrated circuit chips and, more particularly, to package structures and materials for very large scale integrated circuits and packages including a plurality of such chips in which the reliability of connections is enhanced.

2. Description of the Prior Art

The advantages of very high integration density in regard to circuit performance and manufacturing economy have been recognized for some years. Connections of reduced length have reduced capacitance and resistance, reducing signal propagation time and power requirements while increasing noise immunity. Reduced signal propagation time and increased noise immunity can also be developed by minimizing the length of connections between chips, as well. Increased chip functionality can be obtained at lower manufacturing cost by forming more devices (e.g. transistors, storage cells and the like) on a single wafer. For these reasons, there is a trend toward producing larger chips and the packaging of many chips in the same package.

However, increased chip size also increases the dimensional change of the chip during thermal excursions. Moreover, including more chips within a single package as well as increased functionality of each chip tends to increase the amount of heat which must be dissipated by the package. This also increases the magnitude of temperature excursions and resultant dimensional changes of the chip and other structures in the package such as lead frames or laminated chip carriers for making mechanical and electrical connections to individual chips printed circuit boards for making connections between chips and to package terminals and connection structures between the chip carriers and the printed circuit board.

U.S. Pat. No. 5,956,235 to Kresge et al. and assigned to the assignee of the present application discloses a resilient connection for connecting surface metallization on a chip directly to surface metallization on a PCB. The resilient connection disclosed therein includes an upstanding structure including a core of resilient material such as a polymer coated with a conductive material such as metal. This structure apparently relies on a significant stand-off distance (apparently comparable to the transverse dimension of the connection) between the chip and the PCB in order to accommodate a large difference in in-plane CTE between the chip and PCB materials. (Henceforth CTE will refer to in-plane CTE and the units used shall Parts per million per degree C). This stand-off distance appears to compromise the mechanical connection between the PCB and the chip. Moreover, the high aspect ratio connections are substantially cantilevers which would be deflected during different relative accelerations of the chip and PCB, compromising reliability.

As is well known, silicon chips have a coefficient of thermal expansion (CTE) of 3.4 PPM/°C. while the CTE of conventional glass epoxy printed circuit boards (PCB) is much larger: about 17–20 PPM/°C. Alternative reinforced materials having intermediate CTEs which are more closely matched to the CTE of a chip are available such as S-glass, aramid, invar, LCP, etc. but are many times more expensive to purchase or process and prohibitive for most PCB production applications. However, such materials are more commonly and efficiently used for laminated chip carriers (LCC) which are of smaller size. An intermediate CTE material mechanically interposed between a chip and a glass epoxy PCB also serves to reduce stresses from thermal cycling imposed on the connections between the chip and the LCC and the LCC and the PCB. The connections between the chip and the LCC are preferably formed by well-known solder preforms while the connections between the LCC and the PCB are usually formed by a ball grid array; both of which are susceptible to damage such as cracking due to fatigue from repeated stressing by repeated temperature changes. Bonded wire connections are known to be more compliant but are time consuming and expensive to fabricate, present additional failure modes and are not capable of providing as many connections as bonding pads.

In general, it is considered preferable to provide a relatively close match between the CTE of the chip and the CTE of the LCC, particularly since the chips are relatively brittle and can crack under relatively low strain levels. Avoidance of damage to the chip is of high importance in this regard. It can be appreciated that the closeness of the match becomes more critical as chip size is increased. However, as the CTE of the LCC is more closely matched to the CTE of the chip, the difference in CTEs between the LCC and the PCB is increased with consequently increased stress on the ball grid array. As a partial solution, the use of a dielectric material exhibiting a low Youngs modulus of elasticity within at least one of the packaging levels is expected to reduce stress in the overall package. (Henceforth modulus shall refer to Youngs modulus and the units used shall be millions of pounds per square inch, MPSI). However, construction of advanced high density structures with some layers or packaging levels composed entirely of low modulus materials presents additional problems of dimensional stability as well as heat conduction and removal.

In summary, as chip sizes are increased, the CTEs of the chip and the LCC will need to be more closely matched, increasing the mismatch in CTEs between the LCC and other structures, greatly increasing the likelihood of failure of electrical and mechanical connections therebetween. Use of layers of low modulus materials present additional problems while not providing a complete solution to thermally induced mechanical stresses in the package. At the present state of the art, the use of materials having a CTE more closely matched to the chip is not economically feasible in most applications. At the present state of the art, the number and size of chips which can be included in a single package (and, hence, the level of both performance and functionality of an electronic package as well as its reliability) are limited by thermally induced stress at some or even many levels within the electronic circuit package.

SUMMARY OF THE INVENTION

It is therefore an object of the present invention to provide a package structure having low modulus materials only at points necessary for avoidance or reduction of thermally induced stress.

It is another object of the invention to provide an electronic circuit package structure having thermal conduction properties and dimensional stability which are not compromised by low modulus materials included in the package structure.

It is a further object of the invention to provide a mounting pad and electrical connection structure which is compliant in three orthogonal directions.

It is yet another object of the invention to provide increased number and size of chips which can be included in an electronic circuit package without compromising reliability.

It is yet another object of the invention to allow the CTE of a chip carrier to be closely matched to the CTE of a semiconductor chip without compromise of package reliability or requirement of particular PCB materials.

It is yet another object of the invention to provide electrical connections for electronic packages with increased tolerance for thermal mismatch.

In order to accomplish these and other objects of the invention, an electronic circuit package is provided including a plurality of packaging levels, a low aspect ratio deposit of low modulus material at a surface of a packaging structure included in the electronic circuit package, such as a PCB, and a layer of conductive material overlying the deposit of low modulus material and forming a compliant connection pad which is elastically deformable in three mutually orthogonal directions.

In accordance with another aspect of the invention, a compliant connection pad comprising a low aspect ratio deposit of low modulus material at a surface of a packaging structure, a layer of conductive material overlying the deposit of low modulus material and a connection from the packaging structure to the layer of conductive material.

In accordance with another aspect of the invention, a method of limiting stress applied to a chip in an electronic circuit package due to mismatch of packaging elements is provided comprising steps of attaching a chip to a chip carrier formed of a material having a coefficient of thermal expansion similar to that of the chip, and decoupling stress between the chip carrier and another packaging element with a compliant connection pad including a layer of low modulus material.

In accordance with a yet further aspect of the invention, a method of making a compliant connection pad is provided including steps of attaching a layer of low modulus material to a surface, laminating a metal layer to the low modulus material, patterning the metal layer to form a patterned metal layer, and removing unwanted low modulus material.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
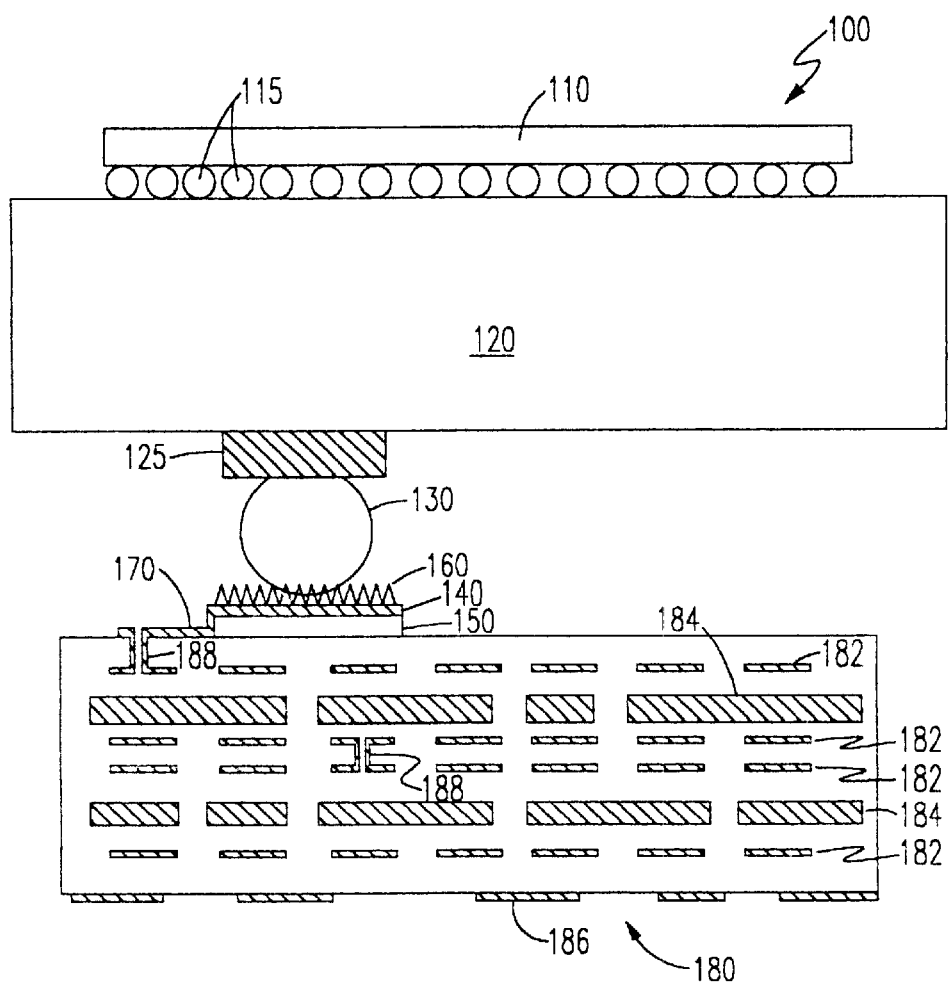
FIG. 1 is a cross-sectional view of a preferred embodiment of the invention.

Referring now to the drawings, and more particularly to FIG. 1, there is shown, in cross-sectional view, a preferred embodiment 100 of the invention. The basic principle of the invention illustrated in FIG. 1 and other Figures is to place low modulus, dimensionally compliant materials only where necessary in relatively low aspect ratio (e.g. 1:1 or less in ratio of connection pad height to transverse dimension) deposits to avoid or reduce stressing of electrical connections, principally between the LCC and PCB, or the chip during thermal cycling of the package.

Specifically, in accordance with the invention, low modulus materials, preferably in the range of 1000 to 200,000 PSI, are used only directly under or as the mounting pad surface, preferably in the form of bumps or filled mounting wells in order to decouple stresses between packaging levels while largely avoiding compromise of heat transfer from the chip. The surface of low modulus material can be metallized, preferably with copper and optionally having a dendritic texture formed thereon, and connections to the metallization made across or through the low modulus material. This structure forms an effectively "soft" mounting pad which is sufficiently compliant to be elastically deformed and relieve stress when dimensional mismatches occur during thermal cycling of the package.

It will be recognized by those skilled in the art that stress levels are difficult to measure or calculate and are affected by numerous factors including the relative thicknesses, CTE and modulus of elasticity of various packaging levels, maximum distance to the neutral point (DNP), assumptions about the zero stress temperature for each packaging level and the stand-off height of the various types of connections (e.g. C4 and ball grid array (BGA)) that may be employed in the package design. In actuality, each of the packaging levels exerts forces on each of the other packaging levels since a stiffer board having a higher CTE can transfer a portion of its greater expansion or shrinkage through the LCC to the chip; effectively increasing the CTE of the LCC. Accordingly, the problem of mutual stressing of the chip and packaging components due to CTE mismatch may be better understood in terms of the amount of strain to be accommodated.

Exemplary values (including an LCC having a CTE substantially intermediate between those of the chip and PCB) are provided in the following Table 1.

TABLE 1

| | | LCC | | |
| --- | --- | --- | --- | --- |
| Packaging level | Chip | top | bottom | PCB |
| CTE, PPM/° C. | 3.4 | 9.0 | 9.0 | 19.0 |
| Modulus, MPSI | 27.0 | 2.0 | 2.0 | 2.0 |
| Pad size, mils | 4–8 | 4–8 | 20–30 | 20–30 |
| Standoff hgt, mils | 4–8 | 4–8 | 20–30 | 20–30 |
| Max DNP, in. | .707 | .707 | 1.41 | 1.41 |
| Max strain, in. (−40 to 125° C.) | .00065 | .00065 | .0023 | .0023 |

As can be seen from Table 1, the strains generated between the LCC and PCB are 3–5 times greater than those between the chip and LCC due to the greater CTE mismatch and distance to neutral point (DNP). However, while strains may appear relatively smaller between the chip and the LCC, the stresses may be much larger due to the very high modulus of the chip material. High stress in combination with the brittleness of the chip dictates a closer matching of the CTEs of the chip and the LCC. However, as alluded to above, the matching of the CTEs of the chip and the LCC is complicated, in practice, by stresses which may be coupled through the LCC from the PCB that effectively increases the CTE of the LCC.

Therefore, in accordance with the invention, a relatively thin mounting pad is employed to decouple stresses between various packaging levels. The thickness of pad required to accomplish this function is widely variable and depends on many of the complex factors discussed above, the packaging level(s) at which it is employed and the actual modulus of the material used for the mounting pad in order to develop a sufficient degree of compliance to accommodate the maximum strain within desired or tolerable stress levels.

However, a thickness in the range of 2–10 mils is generally adequate for successful practice of the invention using rubber materials for the pad.

The soft mounting pad structure in accordance with the invention can be employed at any level of the packaging, such as either the top or bottom surface of the LCC or even the connection surface of the chip without developing significant thermal barriers. However, use between the facing surfaces of the LCC and the PCB is preferred and considered most advantageous since it is most advantageous to more closely match the CTEs of the chip and the LCC. The pitch of connections between the LCC and the PCB allows the aspect ratio of the compliant pad to be minimized while manufacturing tolerances and yield are maximized; facilitating the accommodation of differences in CTEs at a single packaging level. The soft pad is compliant in all three orthogonal coordinate directions and can accommodate not only dimensional changes in or parallel to the plane of the chip or LCC but can reduce manufacturing yield loss from non-planar surfaces or divergence from planarity due to CTE mismatches during temperature excursions.

Figure 2:
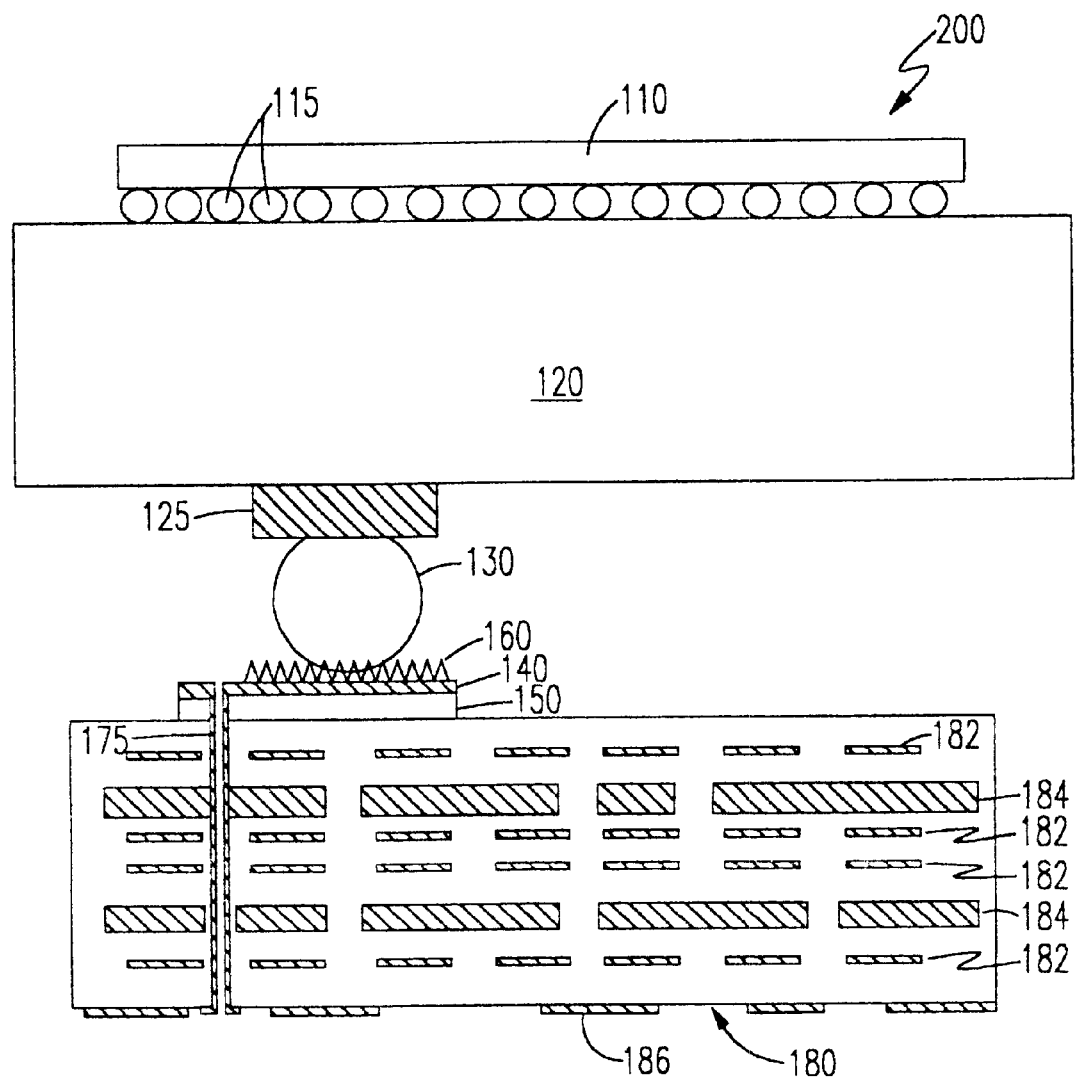
FIG. 2 is a cross-sectional view of a first variant embodiment of the invention.
Figure 3:
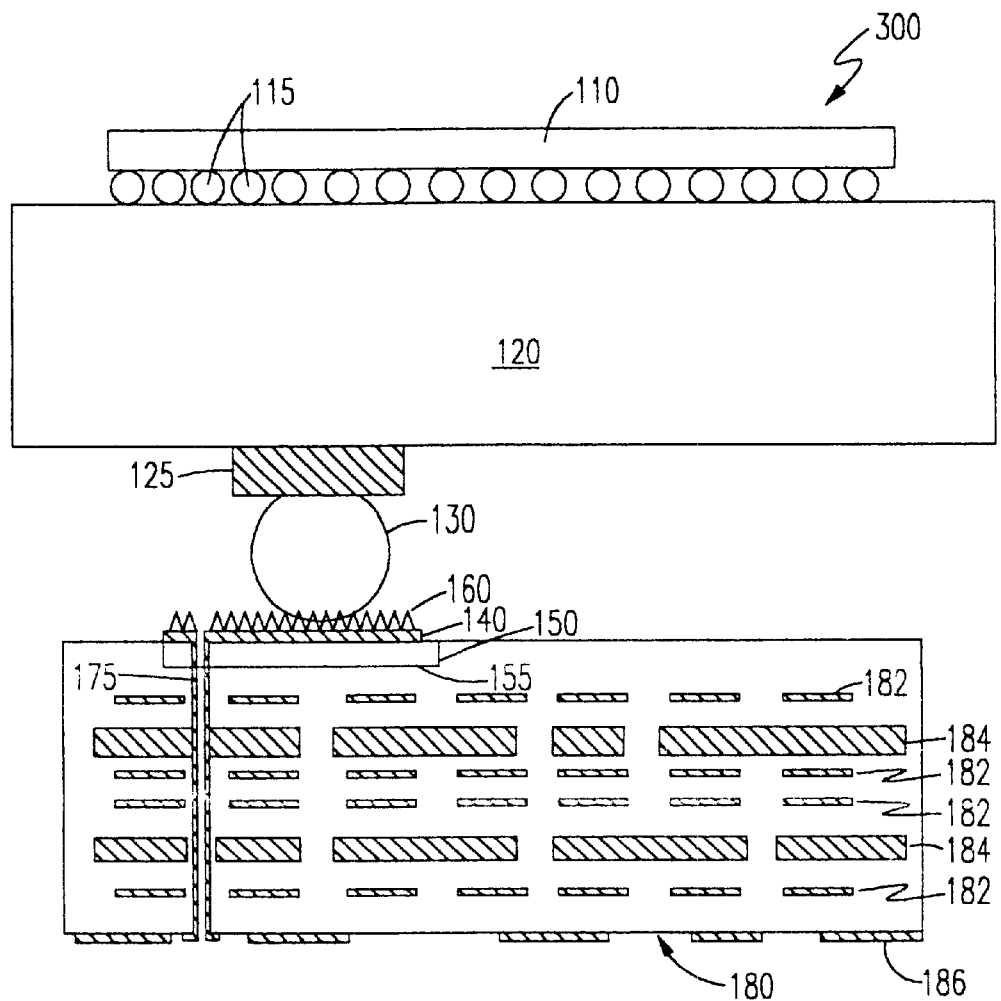
FIG. 3 is a cross-sectional view of a second variant embodiment of the invention.
Figure 4:
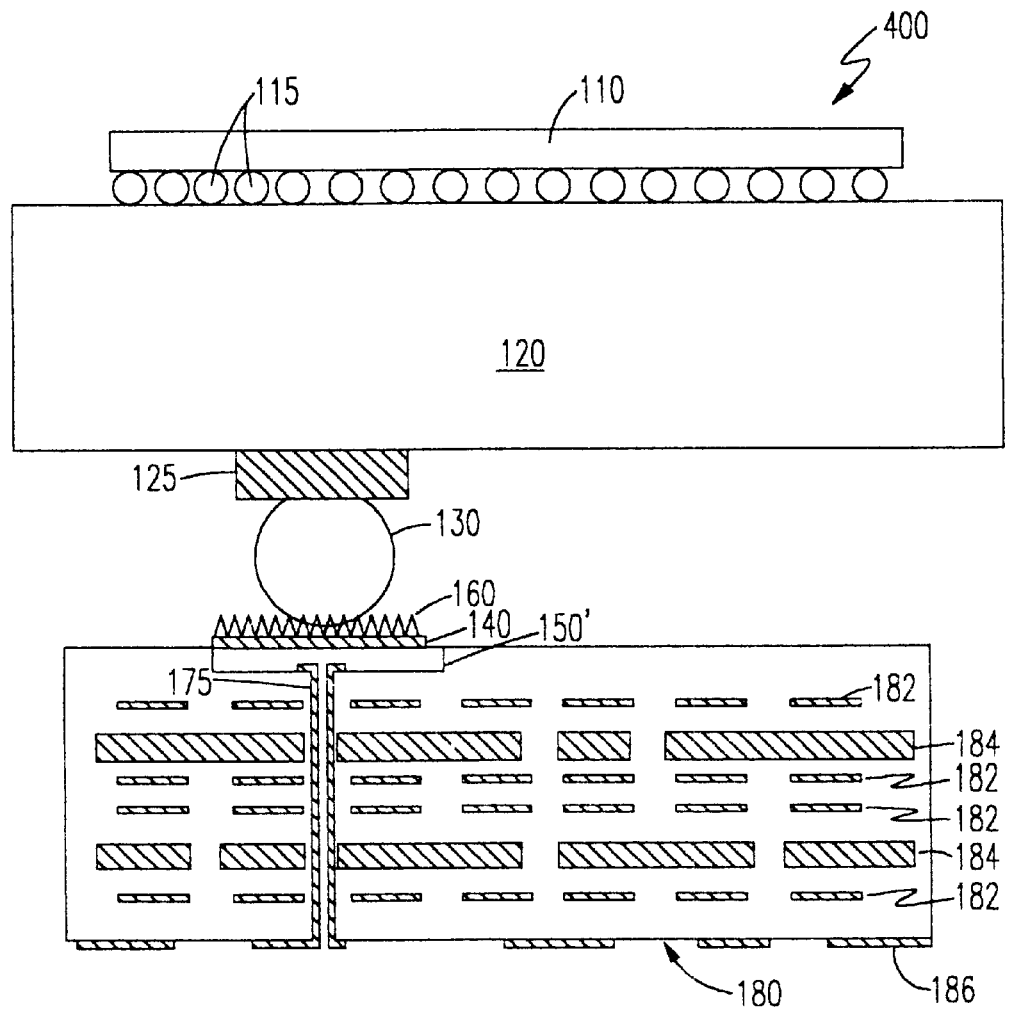
FIG. 4 is a cross-sectional view of a third variant embodiment of the invention.

The soft mounting pad is preferably implemented as illustrated in FIG. 1, with or without the variations illustrated in FIGS. 2–4, which may be freely utilized in any combination. Principal exemplary package structures are also shown for clarity but it is to be understood that the invention may be employed with other package and connection structures whether or not illustrated, such as with C4 connections 115 or raised solder bumps rather than ball grid array (BGA) solder balls 130.

In the combination package structure illustrated in FIG. 1, chip 110 having pads on a surface or edge thereof is attached to laminated chip carrier (LCC) 120 with C4 solder preforms 115 which are well-known in the art. As alluded to above, the material of the LCC 120 may be more or less well matched in CTE to the chip 110. However, particularly when the invention is not employed to relieve stress in a group of connections between structures, a close match of the CTEs of those structures is much preferred and generally allows the invention to be employed at only a single packaging level to accommodate the largest mismatch between CTEs of respective structures in the package.

The bottom side of LCC 120 has a plurality of pads 125 formed thereon. These pads may be adapted in any desired manner to correspond to the type of connection employed between the LCC 120 and the PCB 180, in this particular, preferred case, a solder ball 130 of a ball grid array. A ball grid array is considered somewhat preferable in circuit packaging since it facilitates testing and rework of the package through the level at which the ball grid array is used such as the combination of chips(s) and chip carrier.

The PCB 180 is, in general. a composite, laminated assembly having a potentially complex array of connections thereon and embedded therein in accordance with the design of the package and functions of chips therein and external connection patterns. The PCB 180 will be formed principally of a dielectric material having good structural and mechanical qualities such as the well-known and preferred glass-epoxy material. Numerous signal interconnect planes of patterned conductors 182 will generally be provided, as will a plurality of power planes 184. Bottom surface metallurgy (BSM) 186 is usually provided for formation of external connections. Internal vertical connections such as vias 188 are generally provided to interconnect signal lines 182, power planes 184, BSM 186 and top surface metallurgy (TSM) 170 such as signal lines or power connections, (a power plane connection is not shown in FIG. 1). Power planes are provided with clearance holes to allow plated through holes or vias to pass through them without making electrical connect. TSM BGA pads can connect to any internal signal line or power plane within the board or pass through the clearance holes and connect to a BSM pad.

In accordance with the preferred embodiment of the invention shown in FIG. 1, the composite soft pad is formed by a layer of metallization 140 connected to top surface metallurgy 170 on a compliant pad 150 such a rubber, silicone VMQ, elastomer fluorosilicone FVMQ, or fluoroelastomer FKM, which are particularly preferred at the present time by the inventors although other materials may be well-suited to the practice of the invention, as well. The compliant pads 150 and metallization 140 can be formed, for example, by adhesive lamination of the rubber and copper layers, standard photo pattern processing, etching the of the copper layer and then ablation of the unwanted rubber with a laser.

The thin metallization 140 in combination with a compliant, low modulus layer thus can elastically deform with dimensional changes in the elements connected by the solder balls of the ball grid array or other form of connection. In order to assure good electrical contact between the compliant pad and the solder balls 130, a dendritic texture can be applied to the soft pad by plating the metal of the pad 140 (preferably copper) with a material such as palladium which will form highly conductive sharp spikes which can readily pierce most contaminant layers such as oxides which may form on the solder balls 130. Other forms of bonding such as solder reflow, transient liquid phase (TLP) solder bonding, metal diffusion bonding, etc. can also be used.

The structure of FIG. 1 is preferably formed by laminating the low modulus material and a metal foil/copper layer to the PCB, applying, exposing and developing a photoresist and etching the copper. The unwanted low modulus material can then be ablated with, for example, a carbon dioxide laser using the copper layer as a laser mask. The PCB can then be seeded for further plating of the connection TSM, a patterned resist applied and further copper plated in channels and on the sides of the compliant pads 140, 150, after which the resist and seed can be stripped. Alternatively after laminating the low modulus material to the PCB and patterning it, the surface of both the PCB and low modulus material can be seeded and plated in accordance with a single metallization resist pattern.

Referring now to FIGS. 2–4, variant forms of the preferred embodiment of the invention will now be discussed. Package elements which have been discussed above are indicated with like reference numerals and need not be discussed further.

In the variant of FIG. 2, the compliant pad 150 and the surface metallization thereof 140 is placed on the surface of the PCB 180, as in FIG. 1, and can be formed in the same manner. However, rather than making a connection to the pad with a TSM connection, the variant of FIG. 2 makes a connection to the metallization 140 with a plated through hole (PTH) extending through a portion of the PCB and the compliant pad 150. As is known, plated through holes may be fabricated by many methods such as mechanical drilling, laser ablation and the like followed by metal deposition such as plating or sputtering.

The variant form of the invention shown in FIG. 2 is preferably fabricated by substantially the same process as that described above for the embodiment of FIG. 1. However, the TSM connections may not be required, depending on package electrical design and/or whether or not pads such as are illustrated in FIGS. 1 and 2 are both used together on the same side of a PCB. Through holes can either be formed and plated subsequent to formation of copper pads 140 or simultaneously with pad formation if the pad is formed by patterned plating rather than subtractive etching.

The variant form of the invention shown in FIG. 3 is similar to that of FIG. 2 except that at least the compliant pad 150 is formed in a recess 155 in the PCB. This variant form of the invention provides some advantages in fabrication and mechanical robustness because of the support of the sides of the compliant pad 150 and possibly the metallization 140 by the sides of recess 155 in much the same fashion that fine conductors formed by a Damascene process in integrated circuits. Patterning is established by the recesses and the compliant material (and possibly the metallization can be applied in the form of a liquid or paste. The recesses 155 can be formed by etching, machining, laser ablation or an impression molding process. The low modulus material is then deposited or laminated followed by copper layer 140. The copper layer is then preferably patterned and used as a laser mask for ablating unwanted low modulus material between the compliant pads. As will be appreciated by those skilled in the art, this preferred process for formation of compliant pads as illustrated in FIG. 3 is fully compatible with formation of compliant pads as illustrated in FIGS. 1 and 2 and pads of all three structures can be included on the same surface of a PCB, if desired.

Referring now to FIG. 4, a further variant form of the invention will now be discussed. This form of the invention is similar to that of FIG. 3 except that a conductive rubber or elastomer pad 150' is employed rather than a possibly non-conductive rubber or elastomer compliant pad. Additionally, in such a case, the plated through hole PTH 175 need not extend through the compliant pad but could so extend if desired (e.g. for process compatibility with the forms of the invention shown in FIGS. 1–3. It should also be appreciated, in this regard, that the conductive rubber or elastomer pad need not be recessed but could be formed on the surface of the PCB (or LCC) in the manner of the forms of the invention shown in FIGS. 1 and 2. In any case, however, a conductive layer 140 of metal or alloy is preferably employed to enhance reliability of connections using, for example, solder or dendritic texture as described above.

The preferred method for fabricating the form of the invention of FIG. 4 is similar to that of FIG. 3 except that the PTHs are completed prior to the deposition of the low modulus conductive material 150'. Specifically, after formation of the recesses as described above, a liquid or electrophoretically deposited photoresist is applied, exposed (preferably by laser) and developed and the through holes are drilled. The substrate (e.g. PCB or LCC) is seeded and plated with metal to develop a desired conductive pattern on the surface thereof as well as depositing conductive material on the interior of the through holes. The resist may then be stripped and the PTHs can be filled, if desired.

The low modulus conductive material 150' and metal layer 140 are then laminated to the substrate, either as one or more sheets or as discrete pads. Optionally, a low modulus epoxy solder mask, such as IBM's advanced solder mask (ASM), could be applied as a sheet, bump exposed and laminated with metal (e.g. copper). A resist is then applied, exposed and developed to pattern a mask for etching the metal layer to pattern the pad connection layer which can then serve as a laser ablation mask for removing unwanted low modulus material. Alternatively, the unwanted low modulus material could be removed by a chemical or solvent process, also using the patterned copper as a mask.

In view of the foregoing, it is seen that the invention provides an electronic circuit packaging structure which uses low modulus materials only where required to avoid the creation of thermal barriers in the package while allowing packaging of larger chips in greater numbers in the package and accommodating relative dimensional changes between packaging levels in three orthogonal directions. Further the invention provides a packaging structure which allows the CTEs of the chip and LCC to be more closely matched to provide the above meritorious effects while accommodating significant differences in CTEs to be moved to and accommodated at a single packaging level.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. An electronic circuit package including a plurality of packaging levels, said electronic circuit package including
   a low aspect ratio deposit of low modulus material at a surface of a packaging structure included in said electronic circuit package, and
   a layer of conductive material overlying said deposit of low modulus material and forming, in combination with said deposit of low modulus material, a compliant connection pad which is elastically deformable in three mutually orthogonal directions.

2. A circuit package as recited in claim 1, wherein said compliant connection pad is located between a printed circuit board and a chip carrier.

3. A circuit package as recited in claim 1, wherein said layer of conductive material is provided with a dendritic texture.

4. A circuit package as recited in claim 1, further including a connector on said surface and connected to said layer of conductive material of said compliant connection pad.

5. A circuit package as recited in claim 1, including a plated through hole connection to said layer of conductive material of said compliant connection pad.

6. A circuit package as recited in claim 1, wherein said low modulus material is electrically conductive.

7. A circuit package as recited in claim 1, wherein said compliant connection pad is located in a recess in said surface.

8. A compliant connection pad comprising:
   a low aspect ratio deposit of low modulus material at a surface of a packaging structure,
   a layer of conductive material overlying said deposit of low modulus material and
   a connection from said packaging structure to said layer of conductive material.

9. A compliant connection pad as recited in claim 8, wherein said conductive material is copper.

10. A compliant connection pad as recited in claim 8, wherein said low modulus material is an elastomer.

11. A compliant connection pad as recited in claim 8, wherein said low modulus material is a epoxy solder mask material.

12. A compliant connection pad as recited in claim 8, wherein said low modulus material is conductive.

* * * * *